US010041977B2

(12) United States Patent
Kasai

(10) Patent No.: US 10,041,977 B2
(45) Date of Patent: Aug. 7, 2018

(54) VOLTAGE DETECTING PROBE AND MEASURING DEVICE

(71) Applicant: HIOKI DENKI KABUSHIKI KAISHA, Nagano (JP)

(72) Inventor: Shin Kasai, Nagano (JP)

(73) Assignee: HIOKI DENKI KABUSHIKI KAISHA, Nagano (JP)

( * ) Notice: Subject to any disclaimer, the term of this patent is extended or adjusted under 35 U.S.C. 154(b) by 14 days.

(21) Appl. No.: 15/244,553

(22) Filed: Aug. 23, 2016

(65) Prior Publication Data

US 2017/0067938 A1 Mar. 9, 2017

(30) Foreign Application Priority Data

Sep. 8, 2015 (JP) .................. 2015-176265
May 9, 2016 (JP) .................. 2016-093813

(51) Int. Cl.
*G01R 1/20* (2006.01)
*G01R 15/06* (2006.01)
*G01R 15/16* (2006.01)
*G01R 1/067* (2006.01)
*G01R 1/18* (2006.01)
(Continued)

(52) U.S. Cl.
CPC ......... *G01R 15/06* (2013.01); *G01R 1/06722* (2013.01); *G01R 1/06738* (2013.01);
(Continued)

(58) Field of Classification Search
CPC ........ G01R 21/133; G01R 27/14; G06F 13/20
(Continued)

(56) References Cited

U.S. PATENT DOCUMENTS 4,263,547 A 4/1981 Johnson
5,234,359 A 8/1993 Takahashi et al.
(Continued)

FOREIGN PATENT DOCUMENTS

EP 0 337 875 10/1989
EP 0 551 564 7/1993
(Continued)

OTHER PUBLICATIONS

Extended European Search Report in EP Appl. No. 16 18 3982.4 dated Feb. 10, 2017.
U.S. Appl. No. 15/188,064 to Shin Kasai, filed Jun. 21, 2016.

*Primary Examiner* — Giovanni Astacio-Oquendo
(74) *Attorney, Agent, or Firm* — Greenblum & Bernstein, P.L.C.

(57) ABSTRACT

A voltage detecting probe includes a first shield with an insertion concave formed at a front end; a second shield that has a base end of the first shield inserted thereinto; and a detection electrode formed of a conductive cylindrical member, covered with an insulating covering, and housed inside the first shield. The first shield or detection electrode moves along an axis when an operation lever is moved. When the insulating covering on the front end contacts a measured wire inserted into the insertion concave, the detection electrode and wire become capacitively coupled. The operation lever includes a pillar portion inserted through a guide hole in the second shield and connected to the first shield or detection electrode. A third shield, which is attached to the pillar portion, moves with the operation lever, and shields the guide hole, is disposed inside and/or outside the second shield.

18 Claims, 8 Drawing Sheets

(51) Int. Cl.
*G01R 1/07* (2006.01)
*G01R 1/30* (2006.01)
*G01R 15/12* (2006.01)
*H01R 13/24* (2006.01)

(52) U.S. Cl.
CPC ..... *G01R 1/06766* (2013.01); *G01R 1/06788* (2013.01); *G01R 1/18* (2013.01); *G01R 15/16* (2013.01); *G01R 1/07* (2013.01); *G01R 1/30* (2013.01); *G01R 15/12* (2013.01); *H01R 13/2421* (2013.01)

(58) Field of Classification Search
USPC ............. 324/76.11, 76.61, 76.69, 76.74, 103
See application file for complete search history.

(56) References Cited

U.S. PATENT DOCUMENTS

| | | |
|---|---|---|
| 5,634,828 A | 6/1997 | Stanley |
| 6,617,972 B2 * | 9/2003 | Takarada ............ G08B 21/0484 324/538 |
| 6,756,799 B1 | 6/2004 | Seltzer |
| 8,779,729 B2 * | 7/2014 | Shiraishi ............ G01R 31/3606 320/134 |
| 2008/0062022 A1 * | 3/2008 | Melanson ............. H03M 3/464 341/143 |
| 2008/0079444 A1 * | 4/2008 | Denison .................... G01D 5/24 324/679 |
| 2009/0204350 A1 * | 8/2009 | Govil .................. B81C 99/0045 702/65 |
| 2010/0283539 A1 | 11/2010 | Yanagisawa |
| 2012/0098518 A1 * | 4/2012 | Unagami ............. G01R 22/066 324/74 |

FOREIGN PATENT DOCUMENTS

| | | |
|---|---|---|
| EP | 0 677 747 | 10/1995 |
| JP | 2012-137496 | 7/2012 |
| JP | 2014-52329 | 3/2014 |
| JP | 2014-163670 | 9/2014 |

* cited by examiner

VOLTAGE DETECTING PROBE AND MEASURING DEVICE

1. FIELD OF THE INVENTION

The present invention relates to a voltage detecting probe configured so as to be capable of detecting a voltage of a measured wire and a measuring device equipped with such voltage detecting probe.

2. DESCRIPTION OF THE RELATED ART

Various examples of this type of voltage detecting probe (hereinafter also simply referred to as a "detection probe") have been disclosed by the present applicant in Japanese Laid-open Patent Publications Nos. 2012-137496, 2014-52329, and 2014-163670. As one example, Japanese Laid-open Patent Publication No. 2012-137496 discloses a detection probe equipped with a clamp portion that incorporates a magnetic core and, in a closed state, forms a ring-shaped closed magnetic circuit that surrounds a measured wire. Japanese Laid-open Patent Publication No. 2014-52329 discloses a detection probe including a sensor circuit board housing portion that houses a voltage measuring sensor circuit board and a measured wire pressing portion that is rotatably supported via a rotational shaft on the sensor circuit board housing portion and sandwiches a measured lead between itself and the sensor circuit board housing portion. Japanese Laid-open Patent Publication No. 2014-163670 discloses a detection probe that is equipped with a voltage detecting unit, inside which a detection electrode for detecting voltage and a magnet are disposed, and has a front tip of a measurement probe in which the voltage measuring portion is provided positioned and pressed onto a measured wire using the magnetic force of the magnet. Each of such detection probes is configured as a detection probe where it is possible to detect the voltage of an electrically conducting part of the measured wire simply by capacitive coupling without the electrode used for detection being placed in direct contact with the electrically conducting part (a so-called "contactless voltage detecting probe").

Here, since the detection probes described above respectively have a magnetic core, a clamping or sandwiching mechanism, and a magnet disposed in the periphery of the electrodes used to detect the voltage, the external form, and in particular the form of the part including the electrodes used to detect the voltage, is large. For this reason, with the detection probes described above, it is not possible for example to clamp a single wire when measuring the voltage of a single wire out of a plurality of bundled wires, which makes that kind of measurement operation difficult.

As a means of solving the above problem, the present applicant has developed the detection probe described below. Such detection probe is equipped with a grip portion made of an insulating material, a shield barrel that has an insertion concave formed in a front end thereof and whose base end is connected to the grip portion, and a detection electrode that is formed of a metal cylindrical body, whose front end surface and outer circumferential surface are covered with an insulating covering, and is slidably housed inside the shield barrel. The detection electrode is caused to slide (move) in keeping with operation of an operation lever that is slidably provided on the grip portion. In this case, the detection electrode is connected to a front end of a pillar portion of the operation lever that has been inserted through a second guide hole formed in the shield barrel. In this detection probe, the operation lever is operated to slide the detection electrode toward the front end of the shield barrel so that the front end surface of the detection electrode comes into contact with a wire that has been inserted into the insertion concave. In this state, it is possible to measure the voltage of the wire. Accordingly, with this detection probe, when the shield barrel and/or the detection electrode are formed so as to be slender, it is possible to easily and reliably clamp a single wire out of a plurality of bundled wires, which means that it is possible to reliably measure the voltage of such a wire.

SUMMARY OF THE INVENTION

However, as a result of investigating the detection probe described above, the present inventor discovered the following problem to be solved for the detection probe described above. With the detection probe developed by the present applicant (i.e., a detection probe where the wire is clamped at the front end of the shield barrel), the detection electrode is connected to a front end of a pillar portion of an operation lever that is inserted through a second guide hole formed in the shield barrel. Due to the presence of the second guide hole in this detection probe, there is the risk of the detection probe being affected by noise, which would cause a drop in the measurement precision for voltages. A solution to this problem is desired.

The present invention was conceived to solve the above problem and has a principal object of providing a voltage detecting probe and a measuring device capable of sufficiently reducing the effect of noise and accurately measuring voltage.

To achieve the stated object, a voltage detecting probe according to the present invention comprises a first shield that is barrel-shaped, is electrically conductive and has an insertion concave, into which a measured wire is inserted, formed in a front end thereof by cutting away a part of an outer circumferential wall at the front end along a direction perpendicular to an axis; a second shield that is barrel-shaped, is electrically conductive, and has a base end side of the first shield inserted thereinto; and a detection electrode that is formed of a cylindrical member that is electrically conductive, whose front end surface and outer circumferential surface are covered with an insulating covering, and is housed inside the first shield, wherein one of the first shield and the detection electrode is constructed so as to be capable of moving along a direction of the axis in keeping with a movement operation of an operation lever, and when the insulating covering on the front end surface contacts the measured wire inserted into the insertion concave, the measured wire is clamped by the insertion concave and the front end surface and the detection electrode is capable of capacitive coupling with the measured wire via the insulating covering, the operation lever includes a knob portion and a pillar portion that is inserted through a guide hole formed in the second shield and is connected to the one of the first shield and the detection electrode, and a third shield, which is attached to the pillar portion, is configured so as to be capable of moving in keeping with a movement operation of the operation lever, and shields the guide hole when the measured wire is clamped, is disposed at least one of inside and outside the second shield.

Also, a measuring device according to the present invention comprises the voltage detecting probe; a main body that is connected to the voltage detecting probe; a voltage detector that is disposed inside the main body, detects a voltage of the measured wire via the detection electrode, and outputs a voltage signal that changes in accordance with the voltage; a voltage generator that is disposed inside the main body and generates a voltage that follows the voltage of the measured wire based on the voltage signal; and a processor that is disposed inside the main body and measures the voltage of the measured wire based on the voltage generated by the voltage generator, wherein the voltage detector operates on a floating voltage that has a potential of the voltage generated by the voltage generator as a reference.

With voltage detecting probe and the measuring device, the third shield portion, which is attached to the pillar portion of the operation lever and is configured so as to be capable of moving in keeping with a movement operation of the operation lever and shields the second guide hole of the second shield portion when the measured wire is clamped, is disposed at least one of inside and outside of the second shield portion. This means that according to the detection probe and the measuring device, compared to a configuration where the second guide hole is not shielded when the measured wire is clamped, it is possible to sufficiently reduce the effect of noise on the detection electrode, and as a result, it is possible to accurately measure the voltage of the measured wire.

Also, the voltage detecting probe and the measuring device according to the present invention are configured so that the first shield is capable of moving along a direction of the axis.

Here, with a configuration where the detection electrode is moved, since the pillar portion of the operating lever is connected to the detection electrode, it is necessary to form a guide hole (a guide hole that is similar to the second guide hole of the second shield portion) that allows the pillar portion to pass through in the first shield portion, resulting in a corresponding drop in the shielding effect. On the other hand, the detection probe and the measuring device where the first shield portion is moved, since it is not necessary to form a guide hole and the like in the first shield portion, it is possible to make a corresponding increase in the shielding effect compared to a configuration where the detection electrode is moved.

Also, the voltage detecting probe and the measuring device have the third shield is disposed inside the second shield.

By using the above configuration, it is possible to miniaturize the detection probe compared to a configuration where the third shield portion is disposed outside the second shield portion.

Also, the voltage detecting probe and the measuring device have the third shield is formed in a circular barrel shape.

By using the above configuration, it is possible to surround the detection electrode with the third shield portion, which makes it possible to further increase the shielding effect of the third shield portion.

Also, the voltage detecting probe and the measuring device comprise a front end-side cutaway surface positioned on a front-end side out of cutaway surfaces of the first shield portion that construct the insertion concave is inclined toward a base end side of the shield portion with a reference plane that is perpendicular to the axis as a reference.

By using the above configuration, in a state where the measured wire inserted inside the insertion concave is pressed onto the front end-side cutaway surface by the front end surface of the detection electrode (a state where the measured wire is sandwiched between the front end surface and the front end-side cutaway surface of the detection electrode), it is difficult for the measured wire to come out of the insertion concave.

Also, the voltage detecting probe and the measuring device comprise a base end-side cutaway surface positioned on a base-end side out of the cutaway surfaces of the first shield portion that construct the insertion concave is more inclined toward the base end side than the front end-side cutaway surface with the reference plane as a reference.

By using the above configuration, it is possible, while maintaining the effect of the front end-side cutaway surface being inclined as front end described above (i.e., the effect that it is difficult for the measured wire to come out of the insertion concave), to have the distance along the axis between each cutaway surface gradually increase as the distance from the cutaway surface on the inside that constructs the insertion concave increases (i.e., to use a configuration where the width of the opening of the insertion concave gradually increases), which makes it possible to increase the ease of insertion of the measured wire into the insertion concave.

Also, the voltage detecting probe and the measuring device according to the present invention, comprise a biasing member that constantly biases the detection electrode toward the insertion concave, wherein the detection electrode is caused to slide inside the first shield portion toward the insertion concave by a biasing force of the biasing member so that the measured wire inserted into the insertion concave is sandwiched between the front end surface and a front end-side cutaway surface positioned on a front-end side out of cutaway surfaces of the first shield portion that construct the insertion concave.

By using the above configuration, since it is possible to clamp the measured wire that has been inserted inside the insertion concave between the front end-side cutaway surface of the first shield portion and the front end surface of the detection electrode using the biasing force of the biasing member, even in a state where the hand has been taken off the voltage detection probe, the state of the measured wire being positioned inside the insertion concave is maintained, which improves the user-friendliness of measurement operations for the voltage of the measured wire.

Also, the voltage detecting probe and the measuring device according to the present invention, wherein the front end surface is inclined toward a front end side with a reference plane that is perpendicular to the axis as a reference.

By using the above configuration, in a state where the measured wire inserted inside the insertion concave is pressed onto the front end-side cutaway surface by the front end surface of the detection electrode (a state where the measured wire is sandwiched between the front end surface and the front end-side cutaway surface of the detection electrode), it becomes even more difficult for the measured wire to come out of the insertion concave.

Also, the voltage detecting probe and the measuring device according to the present invention, wherein the outer circumferential surface of the detection electrode, which is covered with the insulating covering and is exposed from the insertion concave to an outside of the first shield in a state where the detection electrode is capacitively coupled with the measured wire, is covered by a conductor layer that electrically contacts the first shield.

By using the above configuration, it is possible to reduce the effect of noise on the measured wire by partially closing the opening of the insertion concave (i.e., to reduce the area of the region of the opening of the insertion concave where a shield member is not present) at a part of the conductor layer, which functions as the shield member by contacting (electrically contacting) the inner surface of the first shield portion and becoming the same potential as the first shield portion, that is exposed from the opening of the insertion concave.

It should be noted that the disclosure of the present invention relates to the contents of Japanese Patent Application 2015-176265 that was filed on Sep. 8, 2015, Japanese Patent Application and Japanese Patent Application 2016-93813 that was filed on May 9, 2016, the entire contents of which are herein incorporated by reference.

BRIEF DESCRIPTION OF THE DRAWINGS

These and other objects and features of the present invention will be explained in more detail below with reference to the attached drawings, wherein.

Preferred embodiments of a voltage detecting probe and a measuring device according to the present invention will now be described with reference to the attached drawings.

First, a voltage detecting probe 1 (hereinafter also referred to simply as the "detection probe 1") as the voltage detecting probe depicted in FIG. 1 will be described with reference to the drawings.

Figure 1:
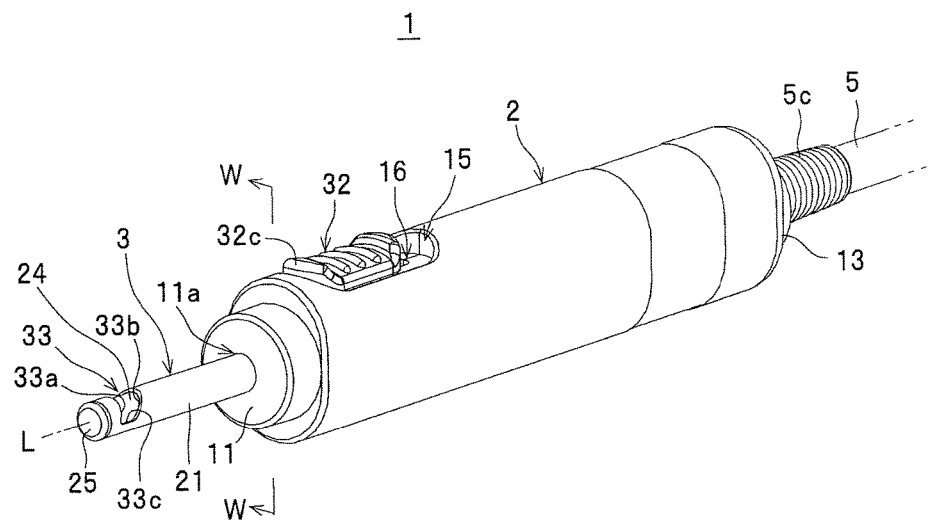
FIG. 1 is a perspective view depicting the configuration of a detection probe.

As one example, as depicted in FIG. 1, the detection probe 1 includes a grip portion 2 and a detection electrode unit 3 and, together with a main body unit 4 (see FIG. 9), described later, constructs a measuring device MD. The detection probe 1 is connected to the main body unit 4 via a shield cable 5 and is used by having a measured wire 6 inserted inside an insertion concave 33, described later, provided in a front end of the detection electrode unit 3. In the present embodiment, the expression "shield cable 5" refers to a cable equipped with a wire for transferring signals and a cable with a shield conductor that shields such wire, and as examples may include a shield wire (this expression includes coaxial cables) equipped with a core wire as a wire for transferring signals and a shield conductor that covers the core wire, and a twisted pair. As one example in the present embodiment, as depicted in FIG. 2, the case where a shield wire equipped with a core wire 5a and a shield conductor 5b that covers the core wire 5a is described as an example of the shield cable 5.

Figure 2:
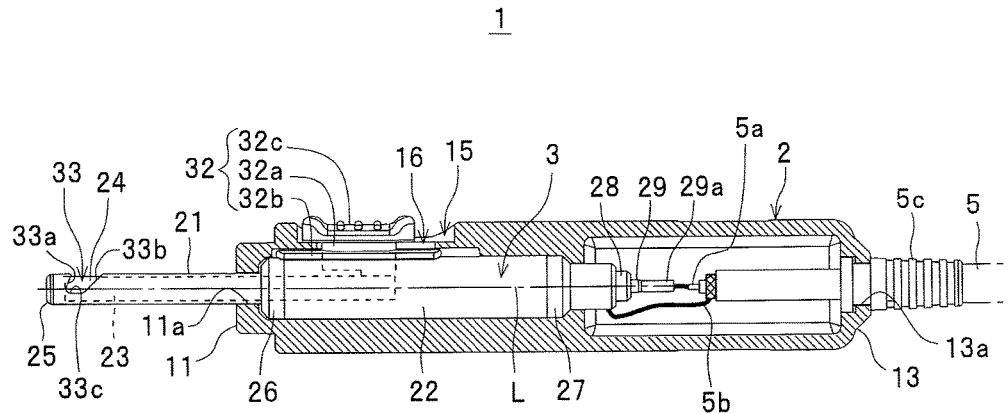
FIG. 2 is a cross-sectional view of the detection probe in a state where the grip portion has been cut along a plane including the axis in FIG. 1 (a cross-sectional view in a state where an insertion concave is closed by the detection electrode)

The grip portion 2 is a member that is held by the user and as one example, as depicted in FIGS. 1 and 2, is formed of a hollow cylindrical body that is capable of housing the detection electrode unit 3 and uses an electrically insulating material such as a synthetic resin material (hereinafter simply referred to as "insulating material"). A through-hole 11a, through which a first shield barrel 21 (a first shield portion), described later, of the detection electrode unit 3 is inserted, is formed in an end surface 11 on a front end (the left end in FIGS. 1 and 2) side of the grip portion 2. As depicted in FIG. 2, a through-hole 13a is also formed in the end surface 13 on the base end (the right end in FIGS. 1 and 2) side of the grip portion 2. By fitting the universal bush 5c, which is integrally attached to the shield cable 5, into the through-hole 13a, the shield cable 5 is joined to the base end of the grip portion 2.

As one example, a channel 15 that extends along a length direction of the grip portion 2 (a direction parallel to the axial direction L (see FIGS. 1 and 2), described later, is formed in an outer surface of an outer circumferential wall of the grip portion 2, and a first guide hole 16 that extends along the length direction of the grip portion 2 is formed in a bottom wall of the channel 15 so as to pass through the base wall (which is one part of the outer circumferential wall of the grip portion 2).

As depicted in FIGS. 2 to 6, as one example the detection electrode unit 3 includes a first shield barrel 21, a second shield barrel 22 (a second shield portion), a detection electrode 23, an insulating covering 24, a first cap 25, a second cap 26, a third cap 27, an insulating barrel 28, a guide barrel 29, a connecting pin 30, a biasing member 31, and an operating lever 32.

DESCRIPTION OF THE PREFERRED EMBODIMENTS

Figure 3:
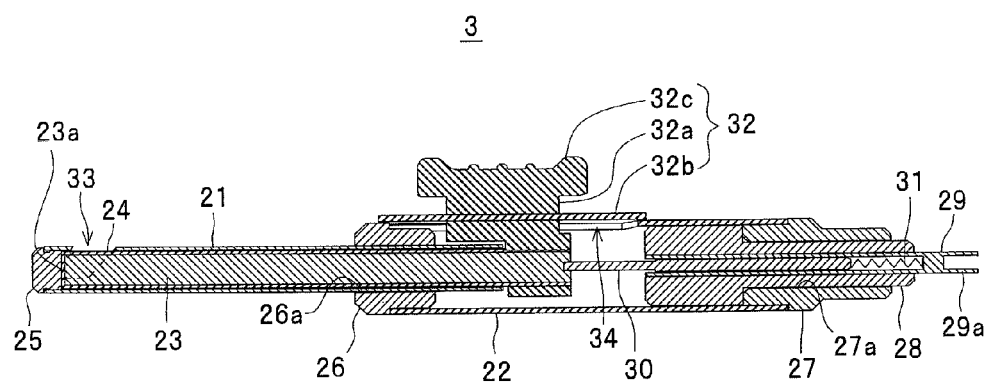
FIG. 3 is a cross-sectional view of a detection electrode unit that has been cut on a plane including the axis in FIG. 2.
Figure 4:
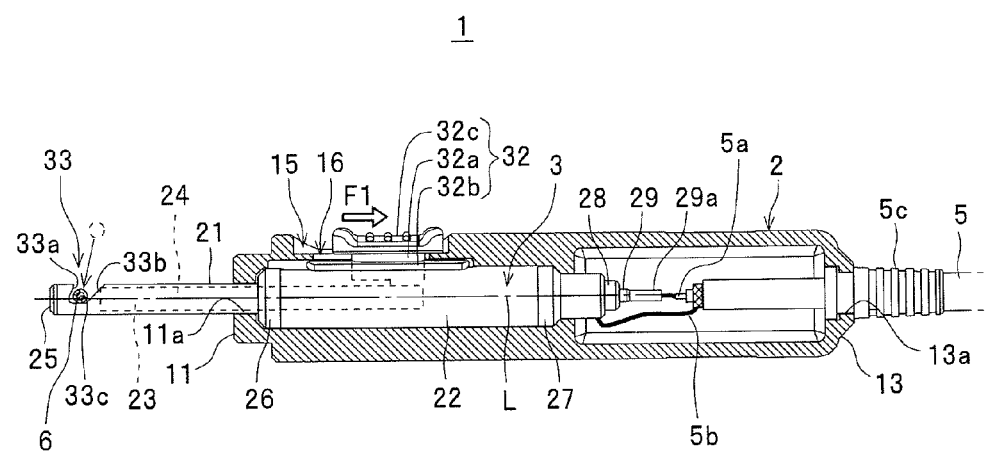
FIG. 4 is a cross-sectional view of the detection probe in a state where the grip portion has been cut along a plane including the axis in FIG. 1 (a cross-sectional view in a state where the insertion concave is open)
Figure 5:
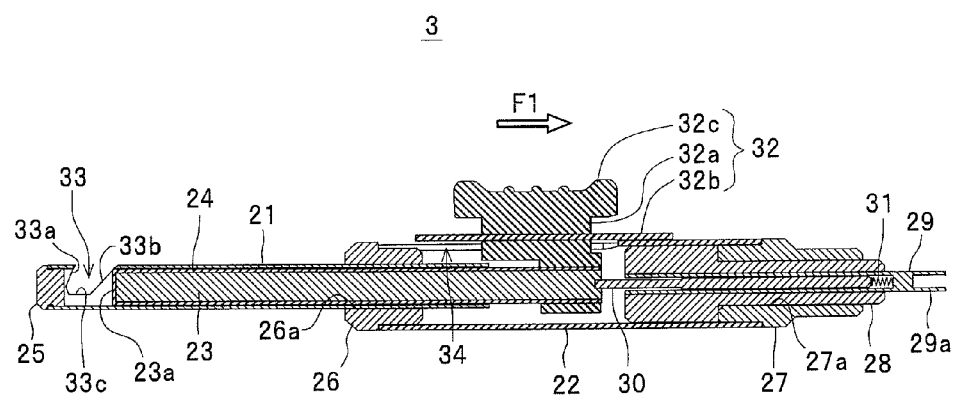
FIG. 5 is a cross-sectional view of the detection electrode unit which has been cut along a plane including the axis in FIG. 4.
Figure 8:
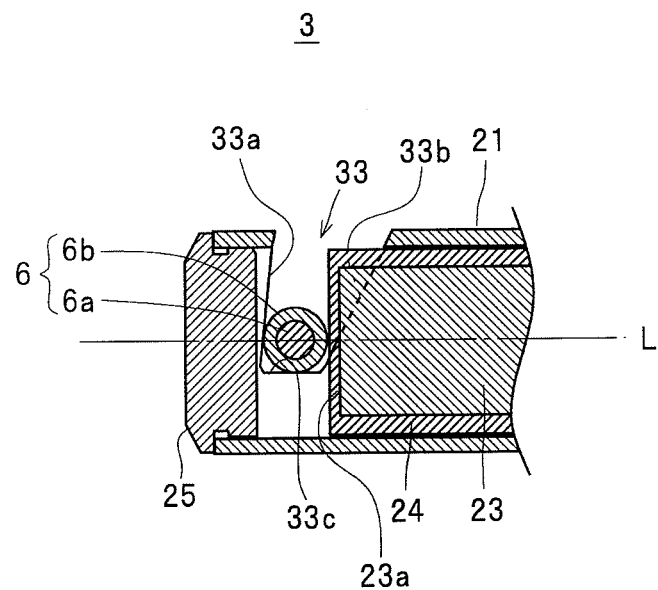
FIG. 8 is a cross-sectional view that is an enlargement of a principal part useful in explaining the configuration of the front end of the first shield cylinder (an enlarged cross-sectional view of a state where the measured wire is sandwiched)

As depicted in FIGS. 3 and 5, the first shield barrel 21 is formed of a rigid member (as one example in the present embodiment, a circular barrel) which as one example has a barrel-shaped external form with a diameter of around 3 mm to 5 mm and uses an electrically conductive material (a metal material that conducts electricity). At the front end (the left end in FIGS. 2 to 6) of the first shield barrel 21, the insertion concave 33, into which the measured wire 6 is inserted (see FIGS. 4, 6, and 8), is formed by cutting away part of the outer circumferential wall of the front end in a direction that intersects the axis L (as one example in the present embodiment, a direction perpendicular to the axis L) by a method such as cutting. Note that as depicted in FIG. 8, the measured wire 6 in the present embodiment is a covered wire where a core wire 6a is covered by an insulating covering 6b. Also, as depicted in FIGS. 3 and 5, the first shield barrel 21 is fixed to a second shield barrel 22 in a state where the base end (the right side in both drawings) of the first shield barrel 21 is housed inside the second shield barrel 22.

Figure 6:
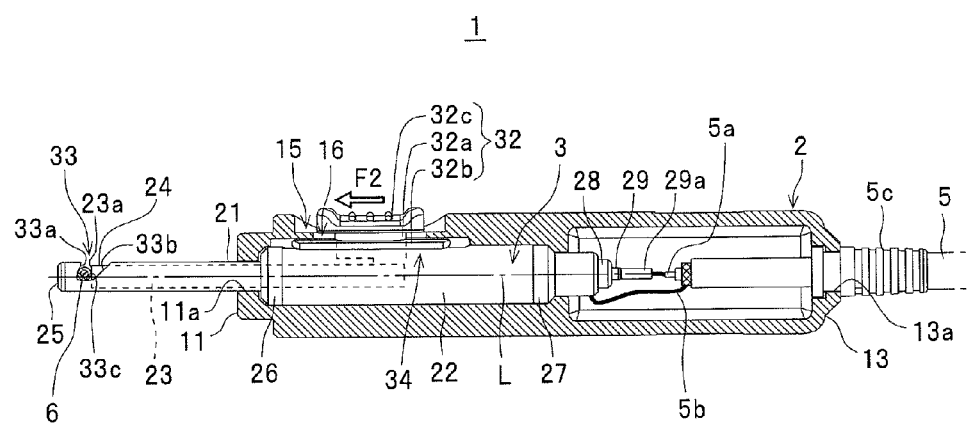
FIG. 6 is a cross-sectional view of the detection probe in a state where the grip portion has been cut along a plane including the axis in FIG. 1 (a cross-sectional view in a state where the measured wire is sandwiched between a front end-side cutaway surface of the insertion concave and a front end surface of the detection electrode)
Figure 7:
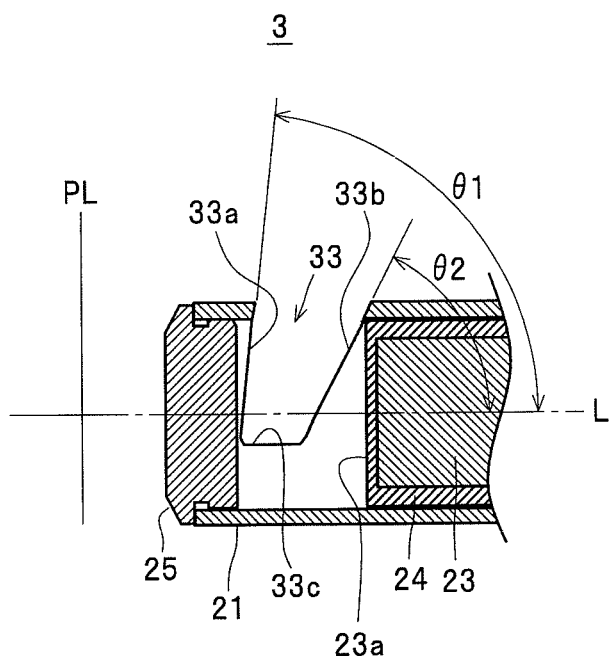
FIG. 7 is a cross-sectional view that is an enlargement of a principal part useful in explaining the configuration of a front end of the first shield cylinder (an enlarged cross-sectional view of a state where the insertion concave is open)

As one example in the present embodiment, as depicted in FIGS. 2 and 5 (in more detail, as depicted in FIG. 7 that is an enlargement of a principal part of FIG. 5), a front end-side cutaway surface 33a that is positioned on a front end-side of the first shield barrel 21 out of cutaway surfaces 33a, 33b, and 33c of the first shield barrel 21 that construct the insertion concave 33 is configured so as to be inclined toward the base end of the first shield barrel 21 relative to a reference plane PL that is perpendicular to the axis L (that is, is configured so that the angle θ1 between the axis L (i.e., a virtual plane including the axis L) and the front end-side cutaway surface 33a is an acute angle). By using this configuration, it becomes difficult for a measured wire 6 that has been inserted inside the insertion concave 33 to come out of the insertion concave 33 in a state (see FIGS. 6 and 8) where, as described later, the measured wire 6 is pressed onto the front end-side cutaway surface 33a by an end surface 23a (hereinafter also referred to as the "front end surface 23a") at the front end side of the detection electrode 23.

As one example in the present embodiment, the base end-side cutaway surface 33b that is positioned on the base end-side of the first shield barrel 21 out of the cutaway surfaces 33a, 33b, and 33c is configured so as to be more inclined toward the base end of the first shield barrel 21 than the front end-side cutaway surface 33a relative to the reference plane PL (see FIG. 7) that is perpendicular to the axis L (that is, is configured so that the angle θ2 between the axis L (i.e., a virtual plane including the axis L) and the base end-side cutaway surface 33b is a smaller acute angle than the angle θ1). By using this configuration, while maintaining the effect described above of the front end-side cutaway surface 33a being inclined (i.e., the effect that it becomes difficult for the measured wire 6 to come out of the insertion concave 33), since it is possible to use a configuration where the distance along the axis L between the cutaway surfaces 33a and 33b gradually widens as the distance from the inner-side cutaway surface 33c (the inner cutaway surface that constructs the insertion concave 33) increases (i.e., a configuration where the open width of the insertion concave 33 gradually increases), it is possible to facilitate insertion of the measured wire 6 into the insertion concave 33.

Also, although the inner-side cutaway surface 33c is constructed as a flat surface that is substantially parallel with the axis L as one example in the present embodiment, the present invention is not limited to this configuration and it is possible to use a configuration where the inner-side cutaway surface 33c is formed as an arced surface.

The measured wire 6 on which the detection probe 1 according to the present embodiment is used is a conductor to which it is difficult to attach the various types of detection probe described in the background art, for example, a single small-diameter wire (covered wire) located extremely close to other conductors (other wires or the like), such as a small-diameter wire that is normally routed in a state where the wire is bundled with similar small-diameter wires.

This means that in the detection electrode unit 3 in the detection probe 1, so long as it is possible to form the insertion concave 33 of a width and depth that enable a small diameter wire as the measured wire 6 to be inserted in the front end, it is possible to use a rigid barrel-shaped member of a smaller diameter as the first shield barrel 21. Also, to make it possible to selectively insert a measured wire 6 into the insertion concave 33, even in a state where the distance between the measured wire 6 and other wires that are adjacent to the measured wire 6 is small, it is preferable to make the rigid barrel-shaped member used as the first shield barrel 21 as slender as possible. As one example, to accept a wire of a small diameter (a diameter of around 2 mm) as described above, it is necessary to form the insertion concave 33 with a depth that is slightly deeper than 2 mm and a width (opening width) that is slightly wider than 2 mm. For this reason, as described above, it is preferable for the first shield barrel 21 to be formed of a rigid barrel-shaped member with a diameter of around 3 to 5 mm, for example.

As depicted in FIGS. 3 and 5, the second shield barrel 22 is formed using an electrically conductive material (a metal material that conducts electricity), is a rigid barrel-shaped member (as one example in the present embodiment, a circular barrel) with a diameter of around 7 to 10 mm as one example of the external form, as depicted in FIGS. 2 and 4, and is fixed to the grip portion 2 in a state where the second shield barrel 22 is housed in the grip portion 2. A second guide hole (through-hole) 34 (corresponding to a guide hole) that extends along the length (the direction of the axis L) of the second shield barrel 22 is formed in an outer circumferential wall of the second shield barrel 22.

As depicted in FIGS. 3 and 5, the detection electrode 23 is formed with a cylindrical external form (a cylinder with a cross-sectional form that matches the cross-sectional form of the first shield barrel 21, as one example in the present embodiment, a circular cylinder) using an electrically conductive material (a metal material that conducts electricity). As one example, surfaces (the front end surface 23a (the left surface) and an outer circumferential surface) of the detection electrode 23 aside from an end surface (the right end surface in FIGS. 3 and 5) on the base end side to which the connecting pin 30 is connected are covered with the insulating covering 24. As one example, the insulating covering 24 is formed with a thickness of under 0.1 mm (as one example, around 0.05 mm) using a synthetic resin material or the like that is electrically insulating.

Also, as depicted in FIGS. 3 and 5, the detection electrode 23 that has the insulating covering 24 formed on its surface as described above is housed inside the first shield barrel 21 so as to be capable of sliding along the axis L direction (i.e., moving relative to the grip portion 2). As depicted in FIG.

3, in a state where the front end surface 23a of the detection electrode 23 contacts the first cap 25 that has been attached, as described later, to the opening at the front end side of the first shield barrel 21, the length by which the base end side of the detection electrode 23 protrudes from the base end side of the first shield barrel 21 is regulated. Also in the present embodiment, as depicted in FIG. 7, the front end surface 23a of the detection electrode 23 is formed so as to be a flat surface that is parallel to the reference plane PL.

The first cap 25 is formed using an electrically conductive material (a metal material that conducts electricity) and is attached by a method such as press fitting or welding (a method that produces an electrical connection) to an opening on a front end (the left end in FIGS. 2 and 3) side of the first shield barrel 21 to close such opening. The second cap 26 is formed using an electrically conductive material (a metal material that conducts electricity) and is attached by a method such as press fitting or welding (a method that produces an electrical connection) to an opening on a front end (the left end in FIGS. 2 and 3) side of the second shield barrel 22. A through-hole 26a is formed in a center part of the second cap 26. The base end side of the first shield barrel 21 described above is inserted inside the through-hole 26a and is joined (fixed) to the second cap 26 by a method such as welding that can achieve an electrically conductive state.

The third cap 27 is formed using an electrically conductive material (a metal material that conducts electricity) and is attached by a method such as press fitting or welding (a method that produces an electrical connection) to an opening on a front end (the right end in FIGS. 2 and 3) side of the second shield barrel 22. A through-hole 27a is formed in a center part of the third cap 27. Note that although a configuration where the first shield barrel 21 and the first cap 25 are formed as separate members and the second shield barrel 22, the second cap 26, and third cap 27 are formed as separate members is used as one example in the present embodiment, it is also possible to use a configuration where the first shield barrel 21 and the first cap 25 are integrally formed and/or a configuration where at least one of the second cap 26 and the third cap 27 (i.e., only the second cap 26, only the third cap 27, or both the second cap 26 and the third cap 27) are integrally formed with the second shield barrel 22.

As depicted in FIGS. 3 and 5, the insulating barrel 28 is formed as a barrel-shaped member (as one example in the present embodiment, a circular barrel) using an insulating material and is attached inside the through-hole 27a of the third cap 27. The insulating barrel 28 electrically insulates the guide barrel 29, which as described later is pressed inside the insulating barrel 28, and the third cap 27 from one another. Accordingly, with the configuration depicted in the drawing, although the insulating barrel 28 is formed with a length that also contacts an inner surface of a base end side of the second shield barrel 22, it should be obvious that it is also possible to use a configuration where the insulating barrel 28 is merely disposed inside the through-hole 27a.

As depicted in FIGS. 3 and 5, the guide barrel 29 is formed as a barrel-shaped member that is open at one end (the left end side in FIG. 3) and is closed at the other end (the right end side in FIG. 3) using an electrically conductive material (a metal material that conducts electricity). Note that in the present embodiment, although a cylindrical protrusion 29a for inserting and soldering to the core wire 5a of the shield cable 5 is formed at the other end surface of the guide barrel 29, the form of the guide barrel 29 is arbitrary. The guide barrel 29 is fixed to the third cap 27 with the insulating barrel 28 positioned in between, such as by being press-fitted inside the insulating barrel 28 from the open end side.

As depicted in FIGS. 3 and 5, the connecting pin 30 is formed as a cylindrical member (a cylindrical member with a cross-sectional form that matches the cross-sectional form of the guide barrel 29, as one example in the present embodiment, a circular cylinder) using an electrically conductive material (a metal material that conducts electricity). The connecting pin 30 is inserted so that one end (the left end side in FIG. 3) protrudes from the guide barrel 29 and the other end (the right end side in FIG. 3) is slidable inside the guide barrel 29. One end of the connecting pin 30 is connected to the base end of the detection electrode 23 in a state where electrical conductivity is maintained.

As one example, the biasing member 31 is constructed of a compression coil spring made of an electrically conductive material (a metal material that conducts electricity), and as depicted in FIGS. 3 and 5, is housed inside the guide barrel 29 in a shortened state (a compressed state) between an inner surface at the other end (which is closed) of the guide barrel 29 and the end surface at the other end of the connecting pin 30. By using this configuration, the biasing member 31 biases the connecting pin 30 from the first end thereof so as to always protrude from the guide barrel 29 (the direction of the front end of the first shield barrel 21). Also, by doing so, the biasing member 31 constantly biases the detection electrode 23 connected to the connecting pin 30, and also the operating lever 32, which as described later is connected to the detection electrode 23, in the direction of the front end of the first shield barrel 21.

As depicted in FIGS. 3 and 5, the operating lever 32 includes a pillar portion 32a in the form of a rectangular solid inserted through a second guide hole 34 of the second shield barrel 22 and a knob portion 32c formed at a front end of a part of the pillar portion 32a that protrudes outside from the second guide hole 34, with such members being integrally formed using an insulating material. An end portion (the lower end in FIGS. 3 and 5) of the pillar portion 32a of the operating lever 32 that protrudes inside the second shield barrel 22 is connected to the detection electrode 23 (more specifically, to the base end side of the detection electrode 23 that protrudes from the first shield barrel 21).

By using this configuration, when the knob portion 32c receives an external force F1 (see FIGS. 4 and 5) in the direction of the base end of the second shield barrel 22 from the thumb of a user holding the grip portion 2, for example, the detection electrode 23 moves together with the connecting pin 30 in the direction of the base end of the second shield barrel 22 against the biasing force of the biasing member 31 in a state where the pillar portion 32a of the operating lever 32 is guided by the second guide hole 34. On the other hand, when the external force F1 described above is removed, the operating lever 32 moves due to the biasing force F2 (see FIG. 6) of the biasing member 31 together with the detection electrode 23 and the connecting pin 30 in the direction of the front end of the second shield barrel 22 so that the front end of the detection electrode 23 contacts the first cap 25.

Also, with the detection electrode unit 3 of this configuration, as depicted in FIGS. 3 and 5, a flange portion 32b is disposed (along an outer surface of the second shield barrel 22) outside the second shield barrel 22 and such flange portion 32b is attached to the pillar portion 32a of the operation lever 32 at a part where the pillar portion 32a protrudes from the second guide hole 34. Accordingly, in keeping with a movement operation of the operation lever 32, the flange portion 32b is moved (slid) along the outer surface of the second shield barrel 22 in a state where the flange portion 32b contacts the outer surface. Here, the flange portion 32b is formed with an arc-shaped (gutter-shaped) cross-section using a conductive material (for example, the same material as the material that constructs the second shield barrel 22), and by contacting the second shield barrel 22, the flange portion 32b is placed at the same potential as the second shield barrel 22. The flange portion 32b is formed slightly longer than the length (i.e., the length along the movement direction of the operation lever 32 (the axis L direction)) of the second guide hole 34 of the second shield barrel 22. In a state (the state depicted in FIG. 6) where the measured wire 6 is clamped by the front end-side cutaway surface 33a of the insertion concave 33 and the end surface 23a of the detection electrode 23, the flange portion 32b functions as a third shield that shields the second guide hole 34.

Also, with the detection electrode unit 3 of this configuration, substantially all of the detection electrode 23, the connecting pin 30 connected to the detection electrode 23, and the guide barrel 29 into which the connecting pin 30 is inserted are configured so as to be covered by the first shield barrel 21, the second shield barrel 22, the first cap 25 press-fitted into the opening at the front end side of the first shield barrel 21, the second cap 26 that closes the opening at the front end side of the second shield barrel 22, and the third cap 27 that covers the opening at the base end side of the second shield barrel 22 that are set at the same potential (the potential of the shield conductor 5b of the shield cable 5), that is, are configured so as to be shielded at the potential of the shield conductor 5b.

As depicted in FIGS. 2, 4, and 6, the detection electrode unit 3 configured as described above is housed inside the grip portion 2 in a state where the first shield barrel 21 is inserted through the through-hole 11a formed in the end surface 11 of the grip portion 2, the pillar portion 32a of the operating lever 32 is inserted through the first guide hole 16 of the grip portion 2, and the knob portion 32c is disposed inside the channel 15 of the grip portion 2. Accordingly, since the first shield barrel 21 is configured so as to be housed in the grip portion 2 so that the base end portion is fixed to the second cap 26 of the detection electrode unit 3 housed inside the grip portion 2, when looking at the detection probe 1 as a whole, the base end portion of the first shield barrel 21 is effectively connected to the grip portion 2.

Also, on an end surface 13 of the grip portion 2, as depicted in FIGS. 2, 4, and 6, the end portion of the shield cable 5 is connected in a state where a universal bush 5c has been fitted into the through-hole 13a formed in the end surface 13. Also, at the end of the shield cable 5 positioned inside the grip portion 2, the core wire 5a of the shield cable 5 is connected to the guide barrel 29 by soldering to the cylindrical protrusion 29a and the shield conductor 5b of the shield cable 5 is soldered to the third cap 27 that constructs the detection electrode unit 3 (that is, the first shield barrel 21 is connected to the shield conductor 5b via the second cap 26, the second shield barrel 22, and the third cap 27).

Figure 9:
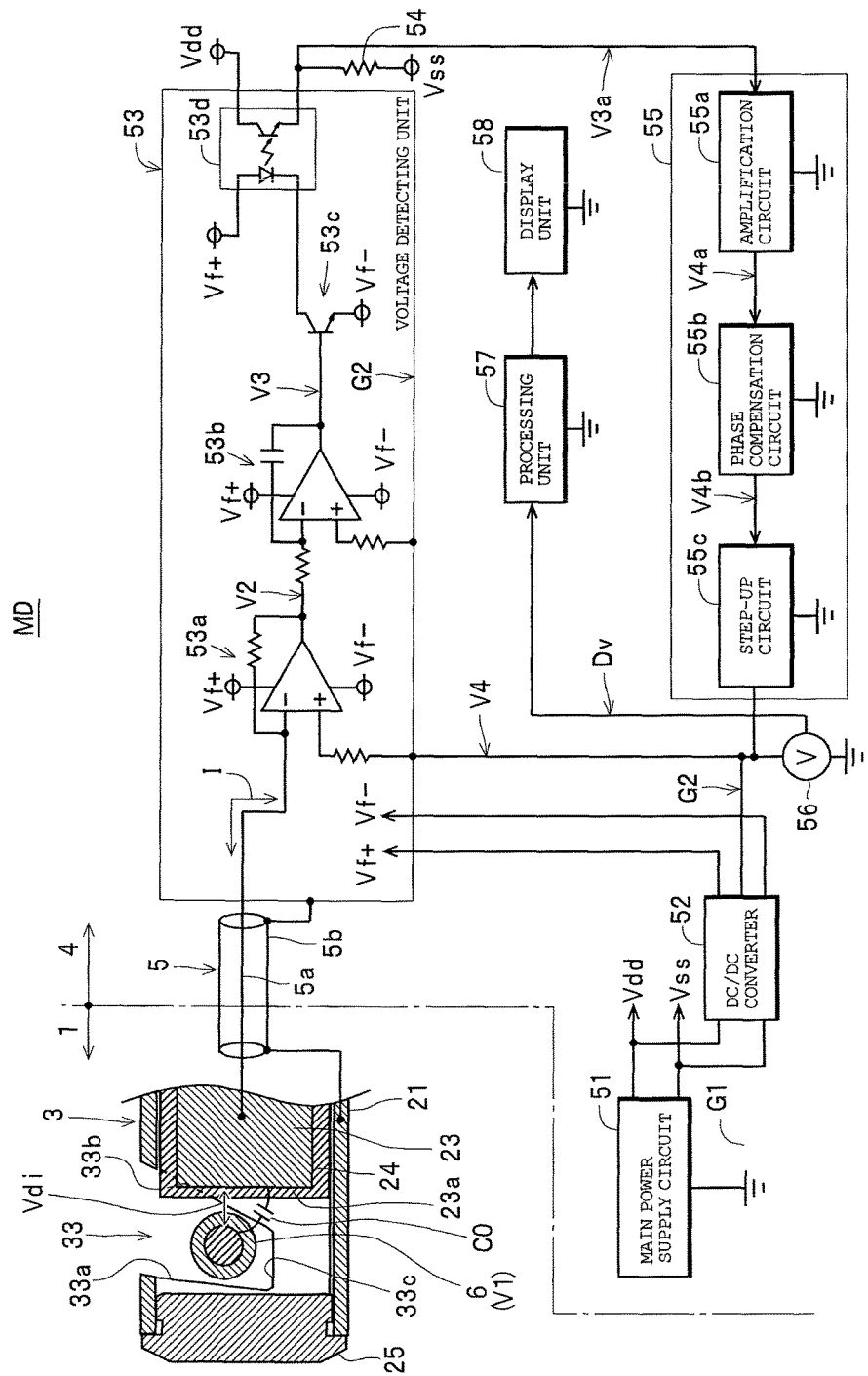
FIG. 9 is a block diagram of a measuring device.

As depicted in FIG. 9, as one example, the main body unit 4 includes a main power supply circuit 51, a DC/DC converter (hereinafter, simply referred to as a "converter") 52, a voltage detecting unit 53, a resistor 54 for current-to-voltage conversion, a voltage generating unit 55, a voltmeter 56, a processing unit 57, and a display unit 58.

The main power supply circuit 51 outputs a positive voltage Vdd and a negative voltage Vss (DC voltages with different polarities but the same absolute value generated with the potential of ground G1 (the first reference potential) as a reference) for driving the various component elements 53 to 58 of the main body unit 4 given above. As one example, the converter 52 includes an insulated transformer with a primary winding and a secondary winding that are electrically insulated from each other, a drive circuit that drives the primary winding of the transformer, and a DC converting unit that rectifies and smoothes an AC voltage induced in the secondary winding of the transformer (none of such components are depicted), and is configured as an insulated power supply where the secondary side is insulated from the primary side.

With this converter 52, the drive circuit operates based on the inputted positive voltage Vdd and negative voltage Vss, and the primary winding of the transformer is driven in a state where the positive voltage Vdd is applied to induce an AC voltage in the secondary winding. The DC converting unit rectifies and smoothes this AC voltage. By doing so, from the secondary side of the converter 52, the positive voltage Vf+ and the negative voltage Vf− that have the internal reference potential (second reference potential) G2 on the secondary side as a reference are generated in a floating state (a state where the ground G1, the positive voltage Vdd, and the negative voltage Vss are electrically separated). The positive voltage Vf+ and the negative voltage Vf− as floating voltages generated in this way are supplied together with the second reference potential G2 to the voltage detecting unit 53. Note that the positive voltage Vf+ and the negative voltage Vf− are generated as DC voltages with different polarities and substantially equal absolute values.

The voltage detecting unit 53 includes a current-to-voltage converting circuit 53a, an integrating circuit 53b, a drive circuit 53c, and an insulating circuit 53d (although a photocoupler driven by the drive circuit 53c is illustrated as an example, it is also possible to use various other configurations, such as an insulating transformer (not depicted), in place of a photocoupler) and, in a state where the reference potential of the voltage detecting unit 53 is set at the second reference potential G2 described above, is driven by receiving supply of the positive voltage Vf+ and the negative voltage Vf− from the converter 52.

As one example, the current-to-voltage converting circuit 53a is configured so as to include a first operational amplifier whose non-inverting input terminal is connected via a resistor to a part of the voltage detection unit 53 that is set at the second reference potential G2 (hereinafter, also referred to as being "connected to the second reference potential G2"), whose inverting input terminal is connected to the core wire 5a of the shield cable 5 (that is, to the detection electrode 23 of the detection probe 1 via the core wire 5a), and has a feedback resistor connected between the inverting input terminal and the output terminal. With this current-to-voltage converting circuit 53a, the first operational amplifier operates on the positive voltage Vf+ and a negative voltage Vf− and converts a detection current (detection signal) I, which flows between the measured wire 6 and the detection electrode 23 due to the potential difference Vdi (see FIG. 9) between the voltage V1 of the measured wire 6 and the second reference potential G2 (which is also the voltage of the voltage signal V4 outputted from the voltage generating unit 55) with a current value in keeping with such potential difference Vdi, to a detection voltage signal V2 and outputs the detection voltage signal V2. Here, the detection voltage signal V2 has an amplitude that changes in proportion to the amplitude of the current signal I.

As one example, the integrating circuit 53b is configured so as to include a second operational amplifier whose non-inverting input terminal is connected via a resistor to the second reference potential G2, whose inverting input terminal is connected via an input resistor to the output terminal of the first operational amplifier, and has a feedback capacitor connected between the inverting input terminal and the output terminal. In this integrating circuit 53b, the second operational amplifier operates on the positive voltage Vf+ and a negative voltage Vf− and by integrating the detection voltage signal V2, an integrated voltage V3 whose voltage value changes in proportion with the potential difference Vdi described above is generated and outputted.

The drive circuit 53c drives the insulating circuit 53d in keeping with the level of the integrated voltage V3 in a linear region, and the driven insulating circuit 53d electrically separates this integrated voltage V3 and outputs as a new integrated signal (first signal) V3a. That is, in combination with the detection probe 1, the voltage detecting unit 53 outputs the integrated signal V3a that indicates the voltage V1 of the measured wire 6.

One end of the resistor 54 for current-to-voltage conversion is connected to the negative voltage Vss and the other end is connected to the corresponding insulating circuit 53d (in the present embodiment, the collector terminal of the phototransistor of the photocoupler) in the voltage detecting unit 53.

By inputting and amplifying the integrated signal V3a, the voltage generating unit 55 generates the voltage signal V4 and applies the voltage signal V4 to a part of the voltage detecting unit 53 that is set at the second reference potential G2. The voltage of the voltage signal V4 changes in accordance with the voltage V1 of the measured wire 6, as described later. By doing so, the positive voltage Vf+ and the negative voltage Vf− that are floating voltages that have the second reference potential G2 as a reference are floating voltages that change in accordance with the voltage of the voltage signal V4.

As one example, the voltage generating unit 55 forms a feedback loop together with the second reference potential G2 of the voltage detecting unit 53 (the shield conductor 5b of the shield cable 5 that is at same potential as the second reference potential G2), the detection electrode 23 and the voltage detecting unit 53 (the current-to-voltage converting circuit 53a, the integrating circuit 53b, the drive circuit 53c, and the insulating circuit 53d (in the present embodiment, a photocoupler), and generates the voltage signal V4 by performing an amplification operation that amplifies the integrated signal V3a so as to reduce the potential difference Vdi.

As one example in the present embodiment, as depicted in FIG. 9, the voltage generating unit 55 includes an amplification circuit 55a, a phase compensation circuit 55b, and a step-up circuit 55c. Here, the amplification circuit 55a inputs and amplifies the integrated signal V3a to generate a voltage signal V4a. In this case, the amplification circuit 55a performs an amplification operation to generate the voltage signal V4a where the absolute value of the voltage value changes corresponding to increases and decreases in the absolute value of the voltage value of the integrated signal V3a. To improve the stability of feedback control operations (to prevent oscillation) the phase compensation circuit 55b inputs the voltage signal V4a, adjusts the phase of the voltage signal V4a, and outputs as a voltage signal V4b. The step-up circuit 55c is constructed of a step-up transformer, for example, and by boosting the voltage signal V4b with a predetermined magnification (i.e., by increasing the absolute value without changing the polarity), generates the voltage signal V4 and applies the voltage signal V4 to the second reference potential G2. The voltmeter 56 measures the voltage signal V4 with the potential of the ground G1 as a reference, converts the voltage value to digital data, and outputs as voltage data Dv.

The processing unit 57 includes a CPU and memory (neither is illustrated), and executes a voltage calculating process that calculates the voltage V1 of the measured wire 6 based on the voltage data Dv outputted from the voltmeter 56. The processing unit 57 has the voltage V1 calculated by the voltage calculating process displayed on the display unit 58 in the form of a table or a graph. The display unit 58 is constructed of a monitor apparatus, such as a liquid crystal display.

When measuring the voltage V1 of the measured wire 6 using a measuring device MD equipped with the detection probe 1 and the main body unit 4, the measured wire 6 is inserted inside the insertion concave 33 formed in the front end of the first shield barrel 21.

More specifically, by applying an external force F1 in the direction of the arrow depicted in FIG. 4 to the knob portion 32c of the operating lever 32 using the hand (more specifically, the fingers), the knob portion 32c (that is, the entire operating lever 32) is slid against the biasing force of the biasing member 31 from the position depicted in FIG. 2 to the position depicted in FIG. 4 (i.e., slid in the direction of the arrow) so that the detection electrode 23 slides inside the first shield barrel 21. By doing so, the detection probe 1 changes from a state where the insertion concave 33 is closed by the detection electrode 23 as depicted in FIG. 2 to a state where the insertion concave 33 is open as depicted in FIG. 4. Next, the measured wire 6 is inserted inside the insertion concave 33 that has become open. Here, since the measured wire 6 is a covered wire, a state where the core wire 6a of the measured wire 6 and the first shield barrel 21 are electrically insulated from one another is maintained.

Also, in the detection probe 1 in particular, as depicted in FIGS. 1 to 6 and in detail in FIG. 8, since a configuration is used where the base end-side cutaway surface 33b that constructs the insertion concave 33 is more inclined toward the base end side of the first shield barrel 21 than the front end-side cutaway surface 33a and the distance between the cutaway surfaces 33a and 33b along the axis L direction gradually widens from the inside toward the opening of the insertion concave 33, it is possible to easily insert the measured wire 6 inside the insertion concave 33.

Next, the user takes his/her hand (fingers) off the knob portion 32c. By doing so, since the external force F1 that was applied to the knob portion 32c is removed, the connecting pin 30 is pressed toward the first shield barrel 21 inside the guide barrel 29 by the biasing force F2 of the biasing member 31. The detection electrode 23 is pressed by the connecting pin 30 and slides inside the first shield barrel 21 toward the first cap 25 to a position where the measured wire 6 is sandwiched between the front end surface 23a of the detection electrode 23 and the front end-side cutaway surface 33a as depicted in FIGS. 6 and 8. By doing so, a clamping operation (attachment operation) of the detection probe 1 to the measured wire 6 is completed.

Here, with the detection probe 1, as shown in FIG. 6, in a state where the measured wire 6 is clamped by the end surface 23a of the detection electrode 23 and the front end-side cutaway surface 33a, the second guide hole 34 formed in the second shield barrel 22 is shielded by the flange portion 32b disposed on the outside of the second shield barrel 22. This means that with the detection probe 1, compared to a configuration where the second guide hole 34 is not shielded in a state where the measured wire 6 is clamped, it is possible to sufficiently reduce the effect of noise (for example, effects caused by other conductors) on the detection electrode 23.

With the detection probe 1, by sandwiching the measured wire 6 in this way, the state where the measured wire 6 is inserted inside the insertion concave 33 is maintained. Accordingly, even in a state where the hand has been removed from the detection probe 1, it is possible to sufficiently avoid a situation where there are large fluctuations in the value of the capacitance C0 (see FIG. 8) formed between the core wire 6a of the measured wire 6 and the front end surface 23a of the detection electrode 23, which is important when measuring the voltage value V1 of the measured wire 6. In this way, the detection probe 1 is configured so that by merely achieving capacitive coupling without the detection electrode 23, which is the electrode used for detection, being placed in direct contact with the core wire 6a of the measured wire 6, the detection probe 1 can function as a contactless voltage detecting probe for conductors (metal) which is capable of accurately detecting the voltage value V1 of the measured wire 6.

Also, as depicted in FIG. 8 and the like, since the detection probe 1 in particular is configured so that the front end-side cutaway surface 33a that sandwiches the measured wire 6 is inclined toward the base end side of the first shield barrel 21 with the reference plane PL as a reference (that is, a configuration where the angle θ1 between the axis L and the front end-side cutaway surface 33a is acute) and the front end surface 23a of the detection electrode 23 is formed as a flat surface that is parallel to the reference plane PL, the gap between the front end-side cutaway surface 33a and the front end surface 23a that sandwich the measured wire 6 gradually narrows from the inside of the insertion concave 33 toward the opening. This means that with the detection probe 1, it is possible to maintain the state where the measured wire 6 is inserted inside the insertion concave 33 more reliably.

In this state, when the potential difference Vdi between the voltage value V1 of the measured wire 6 and the voltage of the second reference potential G2 of the voltage detecting unit 53 (the voltage of the shield conductor 5b of the shield cable 5, the third cap 27 of the detection electrode unit 3, the second shield barrel 22, the second cap 26, the first shield barrel 21, and the first cap 25 that is the same potential as the second reference potential G2, or in other words, the voltage of the voltage signal V4) has increased (for example, when the potential difference Vdi has increased due to an increase in the voltage value V1), at the voltage detecting unit 53 of the main body unit 4, the current value of the current signal I that flows into the current-to-voltage converting circuit 53a from the measured wire 6 via the detection electrode 23 increases. In this case, the current-to-voltage converting circuit 53a lowers the voltage value of the detection voltage signal V2 that is outputted. At the integrating circuit 53b, due to the drop in the detection voltage signal V2, the current flowing via the capacitor toward the inverting input terminal from the output terminal of the second operational amplifier increases. This means that the integrating circuit 53b boosts the voltage of the integrated voltage V3. In keeping with the increase in voltage of the integrated voltage V3, the transistor of the drive circuit 53c enters a "deep on" state. By doing so, at the insulating circuit 53d (photocoupler), the current flowing in the light-emitting diode increases and the resistance of the phototransitor falls. Accordingly, the voltage value of the integrated signal V3a generated by dividing the potential difference (Vdd-Vss) using the resistance value of the resistor 54 and the resistance value of the phototransistor falls.

In the main body unit 4, the voltage generating unit 55 raises the voltage value of the generated voltage signal V4 based on the integrated signal V3a. In this measuring device MD, the current-to-voltage converting circuit 53a, the integrating circuit 53b, the drive circuit 53c, the insulating circuit 53d, and the voltage generating unit 55 that construct a feedback loop in this way carry out a feedback control operation that detects the increase in the voltage V1 of the measured wire 6 and increases the voltage value of the voltage signal V4 so that the voltage (the voltage of the voltage signal V4) of the second reference potential G2 of the voltage detecting unit 53 follows the voltage V1.

Also, when the potential difference Vdi has increased due to a drop in the voltage value V1, the current value of the current signal I that flows out from the current-to-voltage converting circuit 53a to the measured wire 6 via the detection electrode 23 increases. At this time, the current-to-voltage converting circuit 53a and the like that construct the feedback loop carry out a feedback control operation as an opposite operation to the feedback control operation described above to lower the voltage of the voltage signal V4 so that the voltage of the second reference potential G2 and the like of the voltage detecting unit 53 (the voltage of the voltage signal V4) follows the voltage V1.

By doing so, with the measuring device MD, by executing the feedback control operation that causes the voltage of the second reference potential G2 and the like (the voltage of the voltage signal V4) of the voltage detecting unit 53 to follow the voltage V1 in a short time, the voltage of the second reference potential G2 and the like of the voltage detecting unit 53 (which, due to a virtual shorting of the first operational amplifier of the current-to-voltage converting circuit 53a, is also the voltage of the detection electrode 23) is matched to (converges with) the voltage V1. The voltmeter 56 measures the voltage value of the voltage signal V4 in real time and outputs the voltage data Dv that indicates such voltage value. After the voltage signal V4 has converged to the voltage V1 of the measured wire 6, due to the component elements that construct the feedback loop operating as described above, the voltage signal V4 follows the fluctuations in the voltage V1. Accordingly, the voltage data Dv indicating the voltage V1 of the measured wire 6 is continuously outputted from the voltmeter 56.

The processing unit 57 inputs the voltage data Dv outputted from the voltmeter 56 and stores the voltage data Dv in a memory. Next, the processing unit 57 executes the voltage calculating process to calculate the voltage V1 of the measured wire 6 based on the voltage data Dv and stores the voltage V1 in the memory. Finally, the processing unit 57 displays the measurement results (the voltage V1) stored in the memory on the display unit 58. By doing so, measurement of the voltage V1 of the measured wire 6 by the measuring device MD is completed.

Here, as described above, with the detection probe 1, in a state where the measured wire 6 is clamped (the state shown in FIG. 6), since the second guide hole 34 of the second shield barrel 22 is shielded by the flange portion 32b, there is a sufficient reduction in the effect of noise (for example, effects caused by other conductors) on the detection electrode 23. This means that it is possible to accurately measure the voltage V1 with the detection probe 1.

After this, when measuring the voltage V1 of another measured wire 6, first, by applying the external force F1 in the direction of the arrow depicted in FIG. 4 to the knob portion 32c of the operating lever 32 to slide the operating lever 32 in the direction of the base end of the grip portion 2 and also slide the detection electrode 23 in the same direction, the holding of the measured wire 6 between the front end-side cutaway surface 33a of the insertion concave 33 and the front end surface 23a of the detection electrode 23 is released. Next, the measured wire 6 is taken out of the insertion concave 33 (the clamping state of the measured wire 6 is removed). By doing so, it becomes possible to attach (clamp) the detection probe 1 to the next measured wire 6.

In this way, with the detection probe 1 and the measuring device MD, the flange portion 32b, which is attached to the pillar portion 32a of the operation lever 32 and is configured so as to be capable of moving in keeping with a movement operation of the operation lever 32 and shields the second guide hole 34 of the second shield barrel 22 when the measured wire 6 is clamped, is disposed on the outside of the second shield barrel 22. This means that according to the detection probe 1 and the measuring device MD, compared to a configuration where the second guide hole 34 is not shielded when the measured wire 6 is clamped, it is possible to sufficiently reduce the effect of noise on the detection electrode 23, and as a result, it is possible to accurately measure the voltage V1 of the measured wire 6.

According to the detection probe 1 and the measuring device MD equipped with the detection probe 1, a configuration is used where the front end-side cutaway surface 33a positioned on the front end side out of the cutaway surfaces 33a, 33b, and 33c of the first shield barrel 21 that construct the insertion concave 33 is inclined toward the base end side with the reference plane PL as a reference. Therefore, according to the detection probe 1 and the measuring device MD, in a state where the measured wire 6 inserted inside the insertion concave 33 is pressed onto the front end-side cutaway surface 33a by the front end surface 23a of the detection electrode 23 (a state where the measured wire 6 is sandwiched between the front end surface 23a and the front end-side cutaway surface 33a), it is difficult for the measured wire 6 to come out of the insertion concave 33.

Also, according to the detection probe 1 and the measuring device MD equipped with the detection probe 1, a configuration is used where the base end-side cutaway surface 33b that is positioned on the base end side out of the cutaway surfaces 33a, 33b, and 33c of the first shield barrel 21 that construct the insertion concave 33 is more inclined toward the base end side than the front end-side cutaway surface 33a with the reference plane PL as a reference. Accordingly, with the detection probe 1 and the measuring device MD, it is possible, while maintaining the effect of the front end-side cutaway surface 33a being inclined as described above (i.e., the effect that it is difficult for the measured wire 6 to come out of the insertion concave 33), to have the distance along the axis L between the cutaway surfaces 33a and 33b gradually increase as the distance from the inner-side cutaway surface 33c (the cutaway surface on the inside that constructs the insertion concave 33) increases (i.e., to use a configuration where the width of the opening of the insertion concave 33 gradually increases), which makes it possible to increase the ease of insertion of the measured wire 6 into the insertion concave 33.

Also, according to the detection probe 1 and the measuring device MD equipped with the detection probe 1, since it is possible to clamp the measured wire 6 that has been inserted inside the insertion concave 33 between the front end-side cutaway surface 33a of the first shield barrel 21 and the front end surface 23a of the detection electrode 23 using the biasing force of the biasing member 31, even in a state where the hand has been taken off the detection probe 1, the state of the measured wire 6 being positioned inside the insertion concave 33 is maintained, which improves the user-friendliness of measurement operations for the voltage V1.

Also, although the front end surface 23a of the detection electrode 23 is formed as a flat surface that is parallel to the reference plane PL in the detection probe 1 described above, as depicted in FIG. 10, it is also possible to use a configuration where an inclined surface that is inclined toward the front end of the first shield barrel 21 is formed. Accordingly, with a detection probe 1 of this configuration and a measuring device MD equipped with such detection probe 1, in a state where the measured wire 6 inserted inside the insertion concave 33 is pressed onto the front end-side cutaway surface 33a by the front end surface 23a of the detection electrode 23 (a state where the measured wire 6 is sandwiched between the front end surface 23a and the front end-side cutaway surface 33a), it becomes even more difficult for the measured wire 6 to come out of the insertion concave 33.

Figure 11:
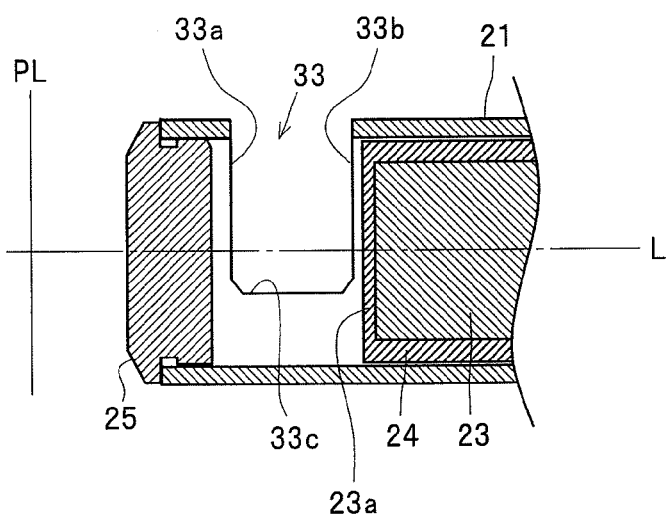
FIG. 11 is a cross-sectional view that is an enlargement of a principal part useful in explaining another configuration of the front end of the first shield cylinder (an enlarged cross-sectional view of a state where the insertion concave is open)

Also, although the detection probe 1 described above uses a configuration where the cutaway surfaces 33a and 33b are inclined toward the base end side of the first shield barrel 21 with the reference plane PL as a reference, the present invention is not limited to such configuration, and as examples, it is also possible to use a configuration where the cutaway surfaces 33a and 33b are both parallel with the reference plane PL as depicted in FIG. 11, and although not illustrated, a configuration where the front end-side cutaway surface 33a is parallel with the reference plane PL and the base end-side cutaway surface 33b is inclined toward the base end side or a configuration where the front end-side cutaway surface 33a is inclined toward the base end side and the base end-side cutaway surface 33b is parallel with the reference plane PL.

Figure 10:
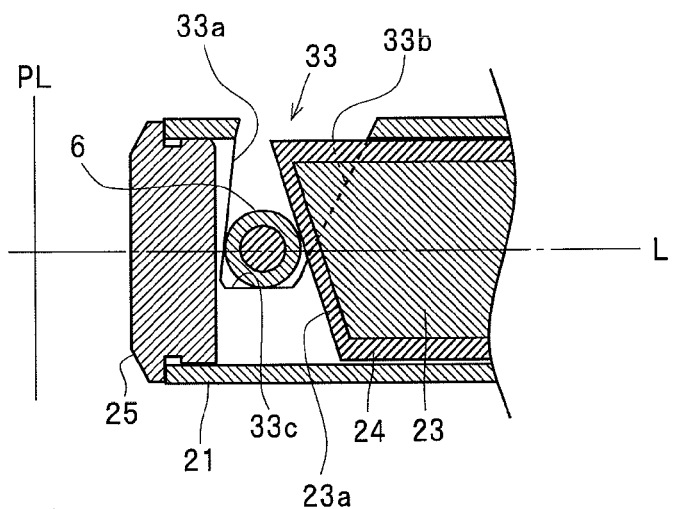
FIG. 10 is a cross-sectional view that is an enlargement of a principal part useful in explaining another configuration of the front end surface of the detection electrode (an enlarged cross-sectional view of a state where the measured wire is sandwiched)

Also, with the detection probe 1 described above (that is, the detection electrode unit 3), as depicted in FIGS. 8 and 10, in a state (or "capacitive coupling state") where the front end surface 23a of the detection electrode 23 and the core wire 6a of the measured wire 6 are capacitively coupled, that is, a state where the measured wire 6 is sandwiched between the front end-side cutaway surface 33a and the front end surface 23a inside the insertion concave 33, there is the risk of the measured wire 6 being somewhat affected by noise received via the opening of the insertion concave 33 where no shield member (a member with the same potential as the potential of the shield conductor 5b) is present. It is therefore preferable to minimize such risk.

Figure 12:
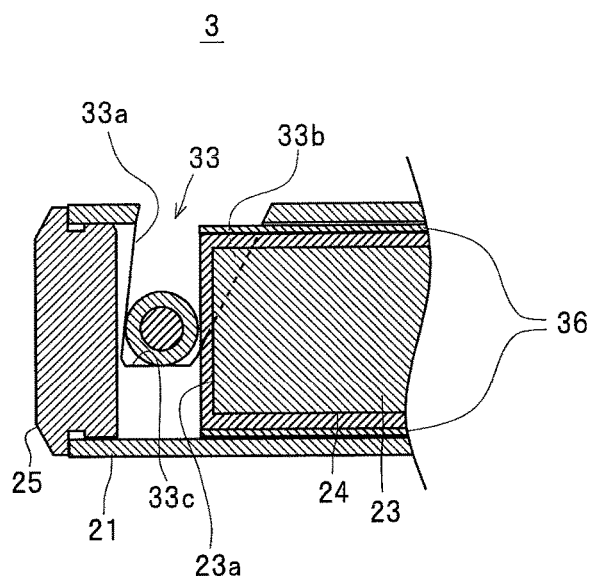
FIG. 12 is a cross-sectional view that is an enlargement of a principal part useful in explaining another configuration of the front end of the detection electrode (an enlarged cross-sectional view of a state where the measured wire is sandwiched)

For this reason, like the detection electrode unit 3 with the configuration shown in FIG. 12, by using a configuration where the outer circumferential surface of the detection electrode 23 (in the present embodiment, the outer circumferential surface of the detection electrode 23 covered by the insulating covering 24 (i.e., the surface of the insulating covering 24)) that is in contact with the inner surface of the first shield barrel 21 is further covered with a conductor layer 36, it is possible to reduce the effect of noise on the measured wire 6 by partially closing the opening of the insertion concave 33 (i.e., to reduce the area of the region of the opening of the insertion concave 33 where a shield member is not present) at a part of the conductor layer 36, which functions as the shield member described above by contacting (electrically contacting) the inner surface of the first shield barrel 21 and becoming the same potential as the first shield barrel 21, that is exposed from the opening of the insertion concave 33. In this case, the conductor layer 36 can be formed using a conductive metal material and as one example is formed on the surface of the insulating covering 24 with a thickness of below 0.1 mm (as one example, around 0.01 mm).

Aside from the voltage measuring function, the measuring device MD may be configured so as to be equipped with a current measuring function, and may also be equipped with other measuring functions such as a resistance measuring function, which measures resistance based on measured voltage and current values, and a power measuring function that measures power.

Figure 13:
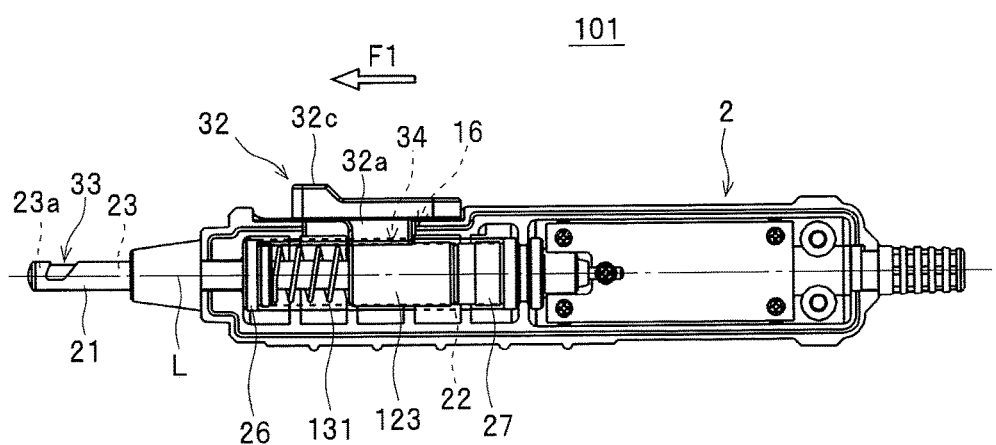
FIG. 13 is a side view, in a state where half of the grip portion has been removed (the half at the front in the drawing), of a detection probe of another configuration.
Figure 14:
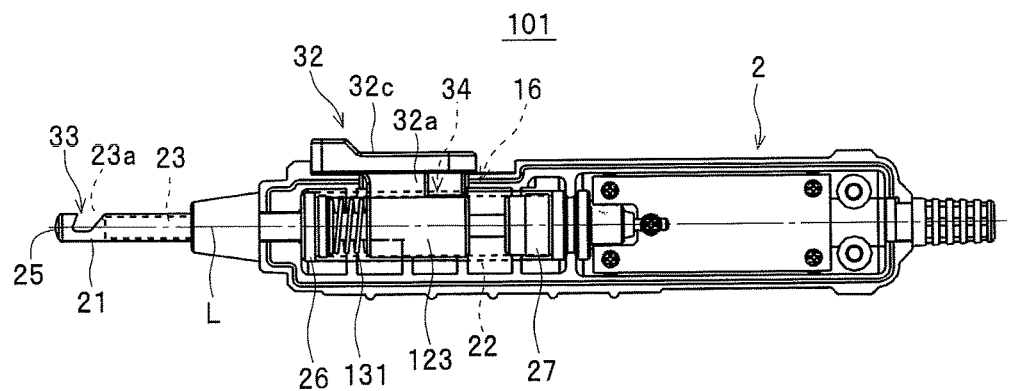
FIG. 14 is a side view, in a state where half of the grip portion has been removed (the half at the front in the drawing), of a detection probe of another configuration where the first shield cylinder has moved to the front end of the grip portion (in a direction that moves away from the base end)

Next, a voltage detecting probe 101 (hereinafter also simply referred to as the "detection probe 101") depicted in FIGS. 13 and 14 will be described as another example of a detection probe. Note that in the following description, component elements that are the same as in the detection probe 1 described above have been assigned the same reference numerals and description thereof is omitted. In this detection probe 101, the second shield barrel 22 is fixed to the grip portion 2. As depicted in FIGS. 13 and 14, this detection probe 101 is configured so that the first shield barrel 21 is capable of moving along the axis L direction relative to the second shield barrel 22 (i.e., relative to the grip portion 2). In this detection probe 101, the detection electrode 23 is also fixed to the grip portion 2.

Here, as depicted in FIG. 13, when the first shield barrel 21 has moved toward the base end of the grip portion 2 (the right end in FIG. 13), the front end surface 23a of the detection electrode 23 is positioned at the front end (the first cap 25) side of the first shield barrel 21 and covers the insertion concave 33. Also, as depicted in FIG. 14, when the first shield barrel 21 has moved to the front end (the left end in FIG. 14) side of the grip portion 2, the front end surface 23a of the detection electrode 23 moves away from the front end of the first shield barrel 21, which opens the insertion concave 33.

Also, as shown in FIGS. 13 and 14, in the detection probe 101, the operation lever 32 is equipped with a pillar portion 32a that is inserted through the second guide hole 34 of the second shield barrel 22 and a knob portion 32c formed at the front end of the pillar portion 32a, with such members being integrally formed using an insulating material. The second shield barrel 22 of the pillar portion 32a and an end portion that extends inside a third shield barrel 123, described later, are connected to the first shield barrel 21 (an end portion, not shown, on the lower side in FIGS. 13 and 14).

Also, as depicted in FIGS. 13 and 14, with the detection probe 101, the third shield barrel 123 that is in the form of a barrel (as one example, a circular barrel), is disposed on the inside of the second shield barrel 22 (along an inner surface of the second shield barrel 22) (in both drawings, the second shield barrel 22 is depicted using broken lines), with the third shield barrel 123 being attached to the pillar portion 32a of the operation lever 32. Accordingly, in keeping with a movement operation of the operation lever 32, the third shield barrel 123 is moved (slid) along the inner surface of the second shield barrel 22 in a state where the third shield barrel 123 contacts such inner surface. Here, the third shield barrel 123 is formed using a conductive material (for example, the same material as the material that forms the second shield barrel 22) in a barrel shape (for example, a circular barrel shape) and by contacting the second shield barrel 22, the third shield barrel 123 is placed at the same potential as the second shield barrel 22. The third shield barrel 123 is formed with approximately the same length as the length (the length along the movement direction of the operation lever 32 (the axis L direction)) of the second guide hole 34 of the second shield barrel 22. In a state where the measured wire 6 is clamped by the front end-side cutaway surface 33a of the insertion concave 33 and the end surface 23a of the detection electrode 23 (i.e., the state depicted in FIG. 15), the third shield barrel 123 functions as a third shield that shields the second guide hole 34.

Also, in this detection probe 101, as depicted in FIGS. 13 and 14, a biasing member 131 is disposed between the second cap 26 and the third shield barrel 123 inside the second shield barrel 22. As one example, the biasing member 131 is constructed of a compression coil spring made of an electrically conductive material (for example, a metal material) and is housed in a compressed state (pressed state). With this configuration, the third shield barrel 123, the operation lever 32 attached to the third shield barrel 123, and the first shield barrel 21 that is connected to the pillar portion 32a of the operation lever 32 are biased toward the base end side of the grip portion 2 by the biasing member 131. Note that it is also possible to use a configuration where a biasing member 131 constructed of an extension coil spring is disposed between the third cap 27 and the third shield barrel 123 inside the second shield barrel 22.

When measuring the voltage V1 of the measured wire 6 using an measuring device MD equipped with this detection probe 101, first, the external force F1 in the direction of the arrow depicted in FIG. 13 is applied by the fingers to the knob portion 32c of the operating lever 32 to move the knob portion 32c against the biasing force of the biasing member 131 from the position depicted in FIG. 13 to the position depicted in FIG. 14 (a movement operation performed on the operating lever 32). At this time, the first shield barrel 21 is caused to move in the direction of the arrow depicted in FIG. 13 due to this movement operation. By doing so, the insertion concave 33 changes from the state where the insertion concave 33 is closed by the detection electrode 23 (the state depicted in FIG. 13) to the opened state (the state depicted in FIG. 14). Next, as depicted in FIG. 15, the measured wire 6 is inserted in the insertion concave 33 that has been placed in the opened state.

Next, the fingers are moved away from the knob portion 32c. At this time, as depicted in FIG. 15, the third shield barrel 123, the operation lever 32, and the first shield barrel 21 are pressed toward the base end side of the grip portion 2 by the biasing force F2 of the biasing member 31. As a result, as shown in FIG. 15, the measured wire 6 becomes sandwiched between the front end surface 23a of the detection electrode 23 and the front end-side cutaway surface 33a of the insertion concave 33. By doing so, the clamping operation (attachment operation) of the detection probe 101 on the measured wire 6 is completed. After this, the various components of the main body unit 4 execute various processes to measure the voltage V1 of the measured wire 6.

Figure 15:
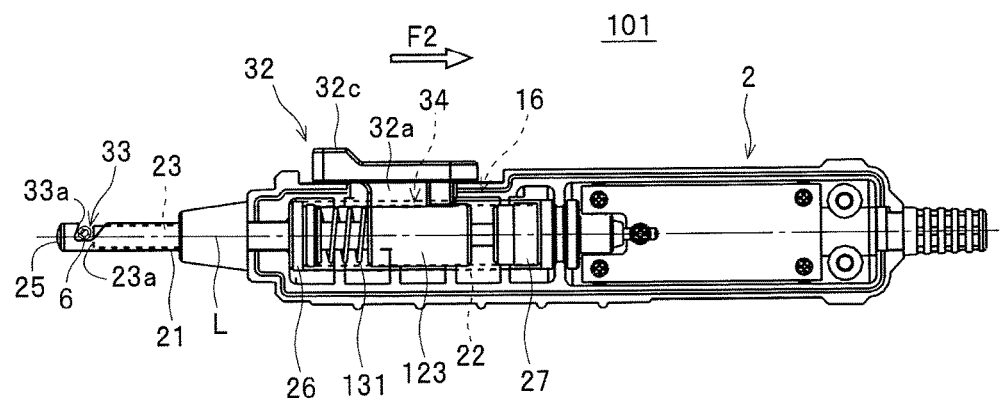
FIG. 15 is a side view, in a state where half of the grip portion has been removed (the half at the front in the drawing), of a detection probe of another configuration in a state where the measured wire is sandwiched.

Here, with the detection probe 1, as depicted in FIG. 15, in a state where the measured wire 6 is clamped by the front end surface 23a of the detection electrode 23 and the front end-side cutaway surface 33a of the insertion concave 33, the second guide hole 34 formed in the second shield barrel 22 is shielded by the third shield barrel 123 that is disposed inside the second shield barrel 22. This means that with the detection probe 101 and the measuring device MD equipped with the detection probe 101, compared to a configuration where the second guide hole 34 is not shielded in a state where the measured wire 6 is clamped, it is possible to sufficiently reduce the effect of noise (for example, effects caused by other conductors) on the detection electrode 23, and as a result, it is possible to accurately measure the voltage V1 of the measured wire 6.

Also, with this detection probe 101 and the measuring device MD equipped with this detection probe 101, the first shield barrel 21 is configured so as to be movable along the axis L direction. Here, with a configuration where the detection electrode 23 is moved, since the pillar portion 32a of the operating lever 32 is connected to the detection electrode 23, it is necessary to form a guide hole (a guide hole that is similar to the second guide hole 34 of the second shield barrel 22) that allows the pillar portion 32a to pass through in the first shield barrel 21, resulting in a corresponding drop in the shielding effect. On the other hand, the detection probe 101 and the measuring device MD where the first shield barrel 21 is moved, since it is not necessary to form a guide hole in the first shield barrel 21, it is possible to make a corresponding increase in the shielding effect compared to a configuration where the detection electrode 23 is moved.

Also, with the detection probe 101 and the measuring device MD equipped with the detection probe 101, unlike a configuration where the third shield barrel 123 is disposed outside the second shield barrel 22, disposing the third shield barrel 123 inside the second shield barrel 22 makes it unnecessary to provide a space between the second shield barrel 22 and the grip portion 2 for disposing the third shield barrel 123 on the outside of the second shield barrel 22, which means that it is possible to miniaturize the detection probe 101 compared to a configuration where the third shield barrel 123 is disposed outside the second shield barrel 22.

Also, according to the detection probe 101 and the measuring device MD equipped with the detection probe 101, by forming the third shield barrel 123 in a circular barrel shape, it is possible to surround the detection electrode 23 with the third shield barrel 123, which makes it possible to further increase the shielding effect of the third shield barrel 123.

Note that the configuration of the voltage detecting probe is not limited to the configuration described above. As one example, for the detection probe 1 described above (a configuration where the detection electrode 23 is moved along the axis L direction), it is also possible to use a configuration where the flange portion 32b that functions as the third shield is disposed inside the second shield barrel 22 and a configuration where flange portions 32b are disposed both inside and outside the second shield barrel 22. Also, in the detection probe 1 described above, it is possible to use a barrel-shaped third shield in place of the flange portion 32b. Also, in the detection probe 101 described above (a configuration where the first shield barrel 21 is moved along the axis L direction), it is possible to use a configuration where the third shield barrel 123 is disposed outside the second shield barrel 22 or a configuration where third shield barrels 123 are disposed both inside and outside the second shield barrel 22. Also, in the detection probe 101 described above, it is possible to use a third shield with an arc-shaped (gutter-shaped) cross section in place of the barrel-shaped third shield barrel 123.

Also, although examples where the detection probes 1 and 101 are constructed so as to include the grip portion 2 have been described above, it is also possible to apply the present invention to a detection probe that does not include a grip portion 2 (i.e., a detection probe constructed of only the detection electrode unit 3). With such configuration, as examples, it is possible to apply the present invention to an arrangement where the detection probe (the detection electrode unit 3) is fixed to a case that houses the main body unit 4 or where the detection probe (the detection electrode unit 3) is fixed to a moving mechanism (where the moving mechanism is operated to clamp the measured wire 6).

What is claimed is:

1. A voltage detecting probe comprising:
 a first shield that is barrel-shaped, is electrically conductive and has an insertion concave, into which a measured wire is inserted, the insertion concave provided in a front end of the first shield and defined by a cutaway part of an outer circumferential wall of the first shield at the front end along a direction perpendicular to a longitudinal axis of the first shield;
 a second shield that is barrel-shaped, is electrically conductive, and has a base end side of the first shield inserted thereinto; and
 a detection electrode that comprises a cylindrical member that is electrically conductive, a front end surface and an outer circumferential surface of the detection electrode are covered with an insulating covering, and the detection electrode is received within the first shield,
 wherein one of the first shield and the detection electrode is capable of moving along a direction of the axis of the first shield in association with a movement operation of an operation lever, and when the insulating covering on the front end surface of the detection electrode contacts the measured wire within the insertion concave, the measured wire is clamped by the insertion concave of the first shield and the front end surface of the detection electrode and the detection electrode is capable of capacitive coupling with the measured wire via the insulating covering,
 the operation lever includes a knob and a pillar that extends through a guide hole in the second shield and is connected to the one of the first shield and the detection electrode, and
 a third shield, which is attached to the pillar, is configured so as to be capable of moving in association with a movement operation of the operation lever, and shields the guide hole when the measured wire is clamped, and the third shield is disposed at least one of inside and outside the second shield.

2. The voltage detecting probe according to claim 1, wherein the first shield is capable of moving along a direction of the axis.

3. The voltage detecting probe according to claim 1, wherein the third shield is disposed inside the second shield.

4. The voltage detecting probe according to claim 1, wherein the third shield has a circular barrel shape.

5. The voltage detecting probe according to claim 1, wherein a front end-side cutaway surface provided on the front-end side of the cutaway part of the first shield that comprises the insertion concave is inclined toward the base end side of the first shield with respect to a reference plane that is perpendicular to the axis.

6. The voltage detecting probe according to claim 5, wherein a base end-side cutaway surface provided on the base-end side of the cutaway part of the first shield that comprises the insertion concave is more inclined toward the base end side than the front end-side cutaway surface with respect to the reference plane.

7. The voltage detecting probe according to claim 1, further comprising a biasing member that constantly biases the detection electrode toward the insertion concave,
 wherein the detection electrode is caused to slide within the first shield toward the insertion concave by a biasing force of the biasing member so that the measured wire in the insertion concave is sandwiched between the front end surface and a front end-side cutaway surface positioned on a front-end side of the cutaway part of the first shield that comprises the insertion concave.

8. The voltage detecting probe according to claim 1, wherein the front end surface is inclined toward a front end side with respect to a reference plane that is perpendicular to the axis.

9. The voltage detecting probe according to claim 1, wherein the outer circumferential surface of the detection electrode, which is covered with the insulating covering and is exposed from the insertion concave to an outside of the first shield, when the detection electrode is capacitively coupled with the measured wire, is covered by a conductor layer that electrically contacts the first shield.

10. A measuring device comprising:
a voltage detecting probe comprising:
   a first shield that is barrel-shaped, is electrically conductive and has an insertion concave, into which a measured wire is inserted, the insertion concave provided in a front end of the first shield and defined by a cutaway part of an outer circumferential wall of the first shield at the front end along a direction perpendicular to a longitudinal axis of the first shield;
   a second shield that is barrel-shaped, is electrically conductive, and has a base end side of the first shield inserted thereinto; and
   a detection electrode that comprises a cylindrical member that is electrically conductive, a front end surface and an outer circumferential surface of the detection electrode are covered with an insulating covering, and the detection electrode is received within the first shield,
   wherein one of the first shield and the detection electrode is capable of moving along a direction of the axis of the first shield in association with a movement operation of an operation lever, and when the insulating covering on the front end surface of the detection electrode contacts the measured wire within the insertion concave, the measured wire is clamped by the insertion concave of the first shield and the front end surface of the detection electrode and the detection electrode is capable of capacitive coupling with the measured wire via the insulating covering,
   the operation lever includes a knob and a pillar that extends through a guide hole in the second shield and is connected to the one of the first shield and the detection electrode, and
   a third shield, which is attached to the pillar, is configured so as to be capable of moving in association with a movement operation of the operation lever, and shields the guide hole when the measured wire is clamped, and the third shield is disposed at least one of inside and outside the second shield, a main body that is connected to the voltage detecting probe;
a voltage detector that is disposed inside the main body, detects a voltage of the measured wire via the detection electrode, and outputs a voltage signal that changes in accordance with the voltage;
a voltage generator that is disposed inside the main body and generates a voltage related to the voltage of the measured wire based, on the voltage signal; and
a processor that is disposed inside the main body and measures the voltage of the measured wire based on the voltage generated by the voltage generator,
wherein the voltage detector operates on a floating voltage that has a potential of the voltage generated by the voltage generator as a reference.

11. The measuring device according to claim 10, wherein the first shield is capable of moving along a direction of the axis.

12. The measuring device according to claim 10, wherein the third shield is disposed inside the second shield.

13. The measuring device according to claim 10, wherein the third shield has a circular barrel shape.

14. The measuring device according to claim 10, wherein a front end-side cutaway surface provided on the front-end side of the cutaway part of the first shield that comprises the insertion concave is inclined toward the base end side of the first shield with respect to a reference plane that is perpendicular to the axis.

15. The measuring device according to claim 14, wherein a base end-side cutaway surface provided on the base-end side of the cutaway part of the first shield that comprises the insertion concave is more inclined toward the base end side than the front end-side cutaway surface with respect to the reference plane.

16. The measuring device according to claim 10, further comprising a biasing member that constantly biases the detection electrode toward the insertion concave,
wherein the detection electrode is caused to slide within the first shield toward the insertion concave by a biasing force of the biasing member so that the measured wire in the insertion concave is sandwiched between the front end surface and a front end-side cutaway surface positioned on a front-end side of the cutaway part of the first shield that comprises the insertion concave.

17. The measuring device according to claim 10, wherein the front end surface is inclined toward a front end side with respect to a reference plane that is perpendicular to the axis.

18. The measuring device according to claim 10, wherein the outer circumferential surface of the detection electrode, which is covered with the insulating covering and is exposed from the insertion concave to an outside of the first shield, when the detection electrode is capacitively coupled with the measured wire, is covered by a conductor layer that electrically contacts the first shield.

* * * * *